US010770862B2

(12) United States Patent
Meehan et al.

(10) Patent No.: US 10,770,862 B2
(45) Date of Patent: Sep. 8, 2020

(54) PACKAGE, AND METHOD OF MANUFACTURING A PACKAGE COMPRISING AN ENCLOSURE AND AN INTEGRATED CIRCUIT

(71) Applicant: Nokia Technologies Oy, Espoo (FI)

(72) Inventors: Rudi O'Reilly Meehan, Dublin (IE); Akshat Agarwal, Dublin (IE); Nicholas M. Jeffers, Dublin (IE)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 16/123,400

(22) Filed: Sep. 6, 2018

(65) Prior Publication Data

US 2019/0081453 A1 Mar. 14, 2019

(30) Foreign Application Priority Data

Sep. 11, 2017 (EP) .................................... 17190462

(51) Int. Cl.
*H01S 5/024* (2006.01)
*H01L 33/64* (2010.01)
*H01L 25/16* (2006.01)
*B33Y 80/00* (2015.01)

(52) U.S. Cl.
CPC .......... *H01S 5/02469* (2013.01); *B33Y 80/00* (2014.12); *H01L 25/167* (2013.01); *H01L 33/647* (2013.01); *H01S 5/02423* (2013.01); *H01S 5/02438* (2013.01)

(58) Field of Classification Search
CPC ............ H01S 5/02407; H01S 5/02423; H01S 5/02469; H01S 5/02476; H01S 5/02484; H01S 5/02492
See application file for complete search history.

(56) References Cited

U.S. PATENT DOCUMENTS

| 4,678,531 A * | 7/1987 | Metzger .................. B41C 1/14 118/504 |
| 9,993,982 B2 * | 6/2018 | Sherrer .................. B22D 19/00 |
| 2004/0028095 A1 * | 2/2004 | Ishida ................. H01S 5/02252 372/36 |
| 2006/0203866 A1 * | 9/2006 | Stephens, IV ...... H01S 5/02423 372/43.01 |

* cited by examiner

*Primary Examiner* — Armando Rodriguez

(57) ABSTRACT

There is disclosed a method of manufacturing an enclosure for an integrated circuit having at least one optical component and at least one electronic component, the method comprising the steps of providing at least one thermal contact connected to at least one of the components, and forming a heat sink that is integral with the enclosure, wherein the at least one thermal contact comprises electrically and thermally conductive metal suitable for transferring heat from the at least one component to the heat sink. There is also disclosed a package comprising an enclosure and an integrated circuit.

20 Claims, 4 Drawing Sheets

PACKAGE, AND METHOD OF MANUFACTURING A PACKAGE COMPRISING AN ENCLOSURE AND AN INTEGRATED CIRCUIT

CROSS-REFERENCE TO RELATED APPLICATION

This application claims the benefit of EP Application Serial No. 17190462.6, filed on Sep. 11, 2017, entitled "PACKAGE, AND METHOD OF MANUFACTURING A PACKAGE COMPRISING AN ENCLOSURE AND AN INTEGRATED CIRCUIT," by O'Reilly et al. The above application is commonly assigned with this application and is incorporated herein by reference in its entirety.

TECHNICAL FIELD

Aspects relate, in general, to a package and method of manufacturing a package comprising an enclosure and an integrated circuit, and in particular in the field of thermal management of photonics integrated circuits.

BACKGROUND

Thermal management is an important factor to scalable three-dimensional packaging of optical and/or electronic components. In particular, optical components require tight thermal control in order to prevent wavelength drift. Photonics integrated circuits incorporate photonics elements which exhibit heat fluxes in excess of >1 $kW/cm^2$ and a temperature-dependence far greater than CMOS-based electronics. When components are densely packed they must be maintained below strict temperature limits to ensure reliable operation. Thus, when optical and electrical components are stacked, the challenges in power delivery and cooling become greatly exacerbated. Since optical inputs and outputs (I/Os) of photonics integrated circuits are pluggable, there is often a high thermal resistance which exists between the photonics integrated circuit and its attached heat sink, which is caused by a low contact pressure between the I/O package and the heat sink that sits atop the package. This makes it difficult to effectively remove heat from the photonics integrated circuit. Heat can be transferred out of the photonics integrated circuit to a heat sink in the ambient environment, where it can be dissipated either passively through free convection and conduction or rack-level forced convection (e.g. fan-assisted dissipation).

SUMMARY

According to an aspect, there is provided a method of manufacturing an enclosure for an integrated circuit having at least one optical component and at least one electronic component, the method comprising the steps of providing at least one thermal contact connected to at least one of the components, and forming a heat sink that is integral with the enclosure, wherein the at least one thermal contact comprises electrically and thermally conductive metal suitable for transferring heat from the at least one component to the heat sink.

The enclosure may be manufactured using additive manufacturing techniques.

A component, a corresponding thermal contact and the heat sink may be positioned relative to one another in three-dimensions or in a stacked configuration.

The method may comprise a step of depositing a metal material and depositing a plastics material, wherein the metal material and plastics material are deposited within a same layer.

The method may comprise one of the steps of forming a microchannel defined within and integrally formed with the enclosure, and forming a vapour chamber defined within and integrally formed with the enclosure.

The method may comprise a step of forming a heat pipe defined within and integrally formed with the enclosure. A branching structure of the heat pipe may be embedded within the heat sink.

The method may comprise a step of aligning the components during manufacture of the enclosure.

The method may comprise a step of forming an electrical connection between each component and an external region of the enclosure.

According to an aspect, there is provided a package comprising an enclosure and an integrated circuit, the enclosure enclosing at least a part of the integrated circuit, the integrated circuit comprising at least one optical component, and at least one electronic component, at least one thermal contact connected to at least one of the components, and a heat sink that is integrally formed with the enclosure, wherein the at least one thermal contact comprises electrically and thermally conductive metal suitable for transferring heat from the component to the heat sink.

The heat sink may be integrally formed with the thermal contact.

The package may comprise at least one embedded liquid microchannel adjacent the at least one thermal contact. The package may further comprise a pump.

The package may comprise at least one vapour chamber thermally connecting a thermal contact to the heat sink.

The package may comprise at least one heat pipe thermally connecting a thermal contact to the heat sink. The at least one heat pipe may have a branching structure embedded within the heat sink.

BRIEF DESCRIPTION OF THE DRAWINGS

Embodiments will now be described, by way of example only, with reference to the accompanying drawings, in which.

DESCRIPTION

Figure 1:
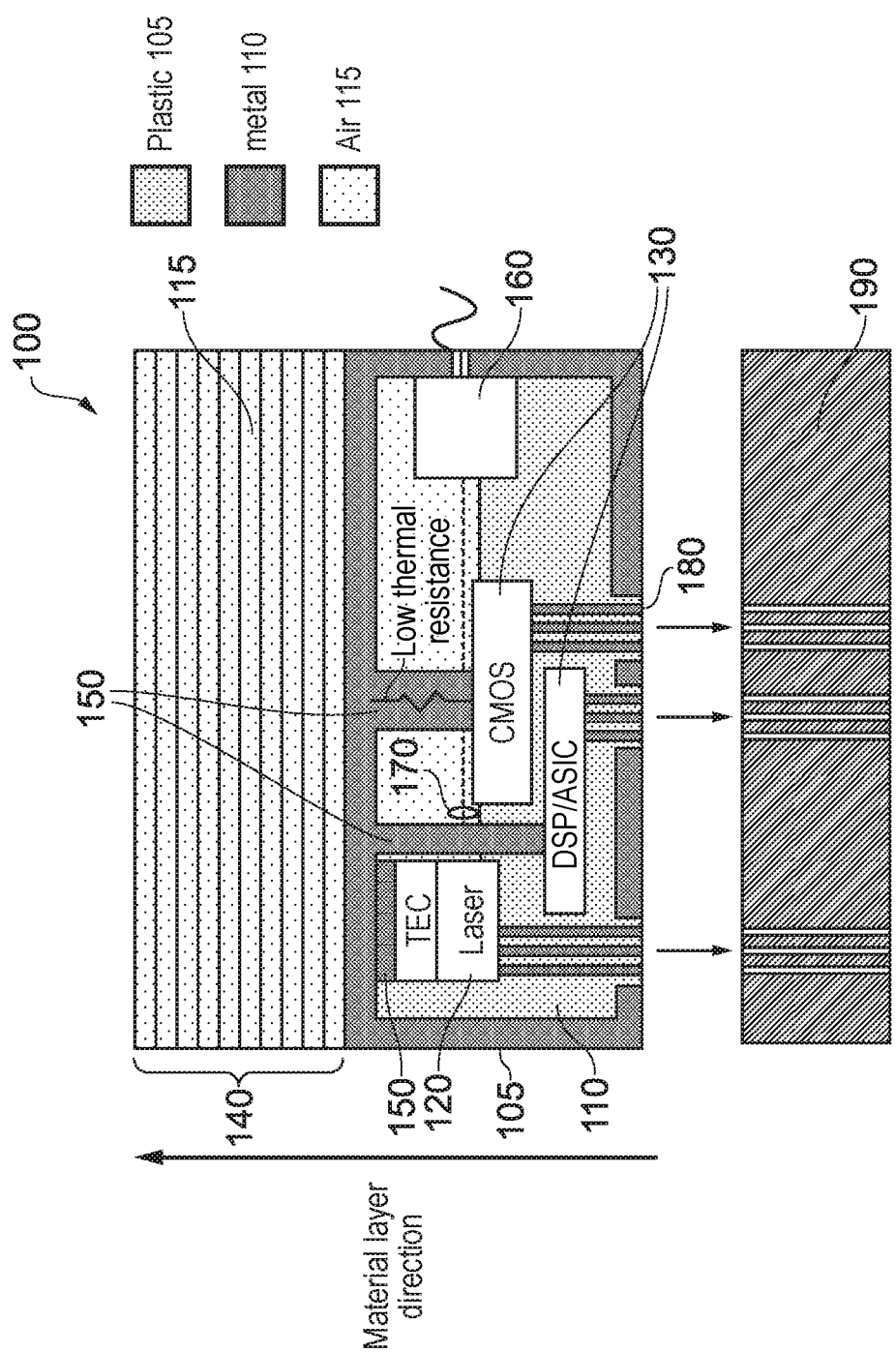
FIG. 1 is a schematic of a photonics integrated circuit for thermal management via conduction based on thermal contacts according to an example.

Examples are described below in sufficient detail to enable those of ordinary skill in the art to embody and implement the systems and processes herein described. It is important to understand that examples can be provided in many alternate forms and should not be construed as limited to the examples set forth herein.

Accordingly, while examples can be modified in various ways and take on various alternative forms, specific examples thereof are shown in the drawings and described in detail below as examples. There is no intent to limit to the particular forms disclosed. On the contrary, all modifications, equivalents, and alternatives falling within the scope of the appended claims should be included. Elements of the examples are consistently denoted by the same reference numerals throughout the drawings and detailed description where appropriate.

The terminology used herein to describe examples is not intended to limit the scope. The articles "a," "an," and "the" are singular in that they have a single referent, however the use of the singular form in the present document should not preclude the presence of more than one referent. In other words, elements referred to in the singular can number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art. It will be further understood that terms in common usage should also be interpreted as is customary in the relevant art and not in an idealized or overly formal sense unless expressly so defined herein.

In general, a photonics integrated circuit will contain both optical components and electronic components. Optical components may include lasers, semiconductor optical amplifiers (SOAs) and micro-ring resonators (MRRs). Electronic components may include CMOS chips and controllers for example. Other components may be present, such as opto-electronic components, optical connects or couplers for example. A "package" incorporates the layering and bonding of each of these components inside some enclosure and may include electronic connections for motherboard printed circuit board (PCB) integration.

The examples described herein relate to a three-dimensional thermal management solution for integrated circuits. The examples provide a three-dimensional packaging solution, which incorporates a three-dimensional arrangement of optical components, electronic components and through-vias for connectors. This is achieved by providing a thermal contact for effectively eliminating the thermal resistance between the package or enclosure and a heat sink. This allows for a stacked opto-electronic architecture to be provided with increased efficiency and at a reduced cost.

Each thermal contact may be comprised of copper and/or aluminium.

There is provided a photonics integrated circuit package that encases at least one optical and one electronic component. The photonics integrated circuit package has a high component density that is enabled by a three-dimensional thermal management solution. The photonics integrated circuit package includes electrically conductive vias to enable short paths between each of the components.

The enclosure may be manufactured using additive manufacturing techniques. An example of an additive manufacturing technique is three-dimensional printing.

FIG. 1 shows an example in which the entire package or enclosure 100 may be printed from the ground up. This is achieved using an additive manufacturing technique. The enclosure may be built in layers using a combination of plastic 105 and metal 110 printing. Air pockets 115 may be incorporated to accommodate other components, such as an optical coupler for example. Unlike plastic, the additively manufactured metal is electrically and thermally conductive. The plastic material acts as an accompanying insulating material. Each two-dimensional layer of printed material can be a combination of plastic and metal printed parts, allowing for a combination of low thermal conductivity plastics and high thermal conductivity metal. This allows for the creation of paths of low thermal resistance. Thus, the package or enclosure is its own thermal management solution. It is possible to switch between these two printing steps where necessary. The layering can be paused at different stages to allow for the attachment and/or alignment of optical 120 and electronic 130 components within the enclosure. A heat sink 140 may be arranged to form a part of the photonics integrated circuit enclosure itself. Whilst the shape of the heat sink in FIG. 1 is shown as a simple geometric shape, the enclosure could be any shape needed to fit within the volume of an overall product or system which uses the integrated circuit.

Through a combination of electrical and plastic layers, it is possible to provide thermal contacts 150 or electrical connections with low thermal resistance paths for thermal management in a single packaging unit. It is possible to embed components within the enclosure and thermally manage these components at a density not available through traditional manufacturing techniques. Since the heat sink may form a part of the package itself, the contact resistance that traditionally typically exists between a heat sink and its package is removed.

Additive manufacturing of the enclosure enables an intricate thermal management and connecting solution that allows for high-density component integration. While three-dimensional thermal management solutions would be difficult to achieve using traditional manufacturing techniques, the methods described herein are not limited to an additively manufactured photonics integrated circuit.

In the example of FIG. 1, heat is transferred from the temperature sensitive components via conduction through the thermal contacts 150 or thermally conductive metal to an air-metal (AM) heat sink. The heat sink may be layered up as an integral part of the package. The photonics components 120 (in this case, the laser) and electronics components 130 (in this case the CMOS and Digital signal processor) may be integrated in three dimensions using the (metal-plastic) composite layering process described above. The thermal contacts 150 comprise a metal-printed "thermal path" which transfers heat from the source 120, 130 (i.e. the component to which the thermal contact is adjacent) to the heat sink 140 by conduction. Heat is then dissipated from the heat sink at rack level, which may be assisted by a fan array for enhancing photonics integrated circuit cooling. A fan may be arranged adjacent the heat sink.

The heat sink may be layered up as part of the package or enclosure 100 such that heat can be conducted straight from the source to the dissipating heat sink structure, without the contact resistance associated with existing packages. For example, the heat sink may be embedded during additive manufacturing and may be a single-phase heat sink allowing for heat to be released into the surrounding environment, which can provide fan-assisted convection dissipation. This method removes heat from the components to the heat sink to stabilise the components. In an example, a temperature of the optical component (in this case the laser) may be further stabilised using an embedded thermoelectric cooler.

In an example, a microfluidic network may be embedded within the photonics integrated circuit for thermal management of the optical and/or electrical components. Microfluidics have the capability to remove large heat fluxes from temperature-sensitive components in an efficient and scalable way. While microfluidic channels have previously been proposed for photonics integrated circuit level cooling applications, an associated pump is typically kept external to the package. This requires fluidic feedthroughs to each photonics integrated circuit and a secondary heat exchanger external to the photonics integrated circuit. By leveraging a ground-up approach based on additive manufacturing techniques, a three-dimensional microfluidic network and pump can be integrated in the package or enclosure, in order to create a fully enclosed thermal management solution. Heat can be removed from each component via thermal contacts and dissipated from the air-metal package heat sink at rack level, for example using forced convection (i.e. a fan). The approach described herein removes the need for fluidic through-vias, meaning that fluidic channels are not required at motherboard level. The approach described allows for microfluidic channels to be layered up and/or filled during the additive manufacturing process.

Multiple parallel flow loops within the microfluidic network may be incorporated, with each flow loop serving to thermally manage a different component. A plurality of thermal contacts 150 may be connected to a respective plurality of components. Where the microchannel comprises a plurality of flow loops, each flow loop may be connected to a respective plurality of components.

In an example, a photonics integrated circuit may be provided with a vapour chamber. The vapour chamber may employ two-phase convection to transfer heat from the components to the heat sink. The vapour chambers can passively transfer extremely large heat fluxes without the need for a pump. According to an example, a custom-shaped vapour chamber is embedded into the package or enclosure during manufacturing. The vapour chamber may be provided with plastic supports 350 ensuring structural integrity.

The vapour chamber can be filled with a working fluid that is compatible with the particular metal used for the thermal contacts or the three-dimensionally printed metal (i.e. the fluid will not cause the metal to corrode or decay). Some suitable metal-fluid combinations include copper-water and aluminium-acetone, for example.

The vapour chamber can allow for large amounts of heat to be transferred, with no contact resistance, to the air-metal heat sink. Once the heat has been transferred to the heat sink it can be dissipated passively or actively, for example, through fans at rack level.

Figure 2:
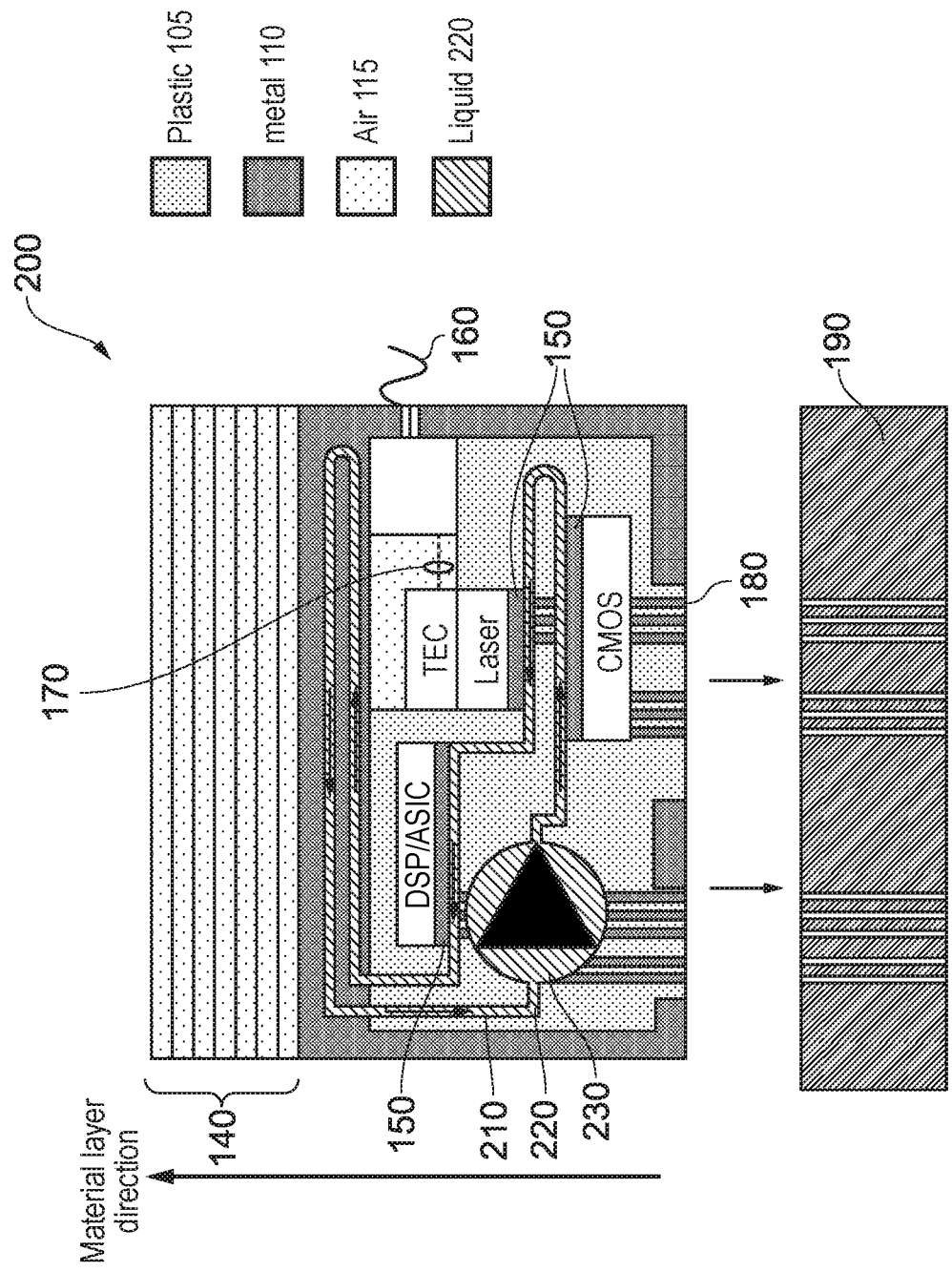
FIG. 2 is a schematic of a photonics integrated circuit for thermal management via convection based on an embedded liquid channel according to an example.

In the example of FIG. 2 is shown a photonics integrated circuit within a package or enclosure 200. The photonics integrated circuit and/or enclosure may be additively manufactured, combining plastic and metal printing. Thermal contacts 150 are provided adjacent the optical and/or electronic components. The example of FIG. 2 provides electrical and thermal management of the photonics integrated circuit based on an embedded liquid microchannel 210. In this example, heat is transferred (via conduction) from the temperature sensitive components through the thermal contacts 150 to the liquid 220 in the microchannel (via convection). The heat transfer between the microchannel liquid and the components and heat sink 140 may be achieved via single-phase convection. A pump 230 may be embedded to pump the liquid through a microfluidic network. The heat inside the liquid in the microchannel is transferred to an air-metal heat sink. The heat sink dissipates heat from the liquid into the surrounding environment. The enclosure therefore provides a fully enclosed, liquid-cooled package for the integrated circuit.

In an example, multiple vapour chambers are incorporated in the enclosure, with each vapour chamber serving to thermally manage one or several components. A plurality of thermal contacts 150 may be connected to a respective plurality of components. Where the enclosure comprises a plurality of vapour chambers, each vapour chamber may be thermally connected to a respective plurality of components.

The enclosure and/or circuit and vapour chamber may be formed using additive manufacturing techniques. This allows for construction of the architecture with a high degree of design freedom such that each vapour chamber can be custom-shaped. As such, the vapour chambers do not have to be constrained to simply shaped cuboids as with existing vapour chamber construction techniques.

Figure 3:
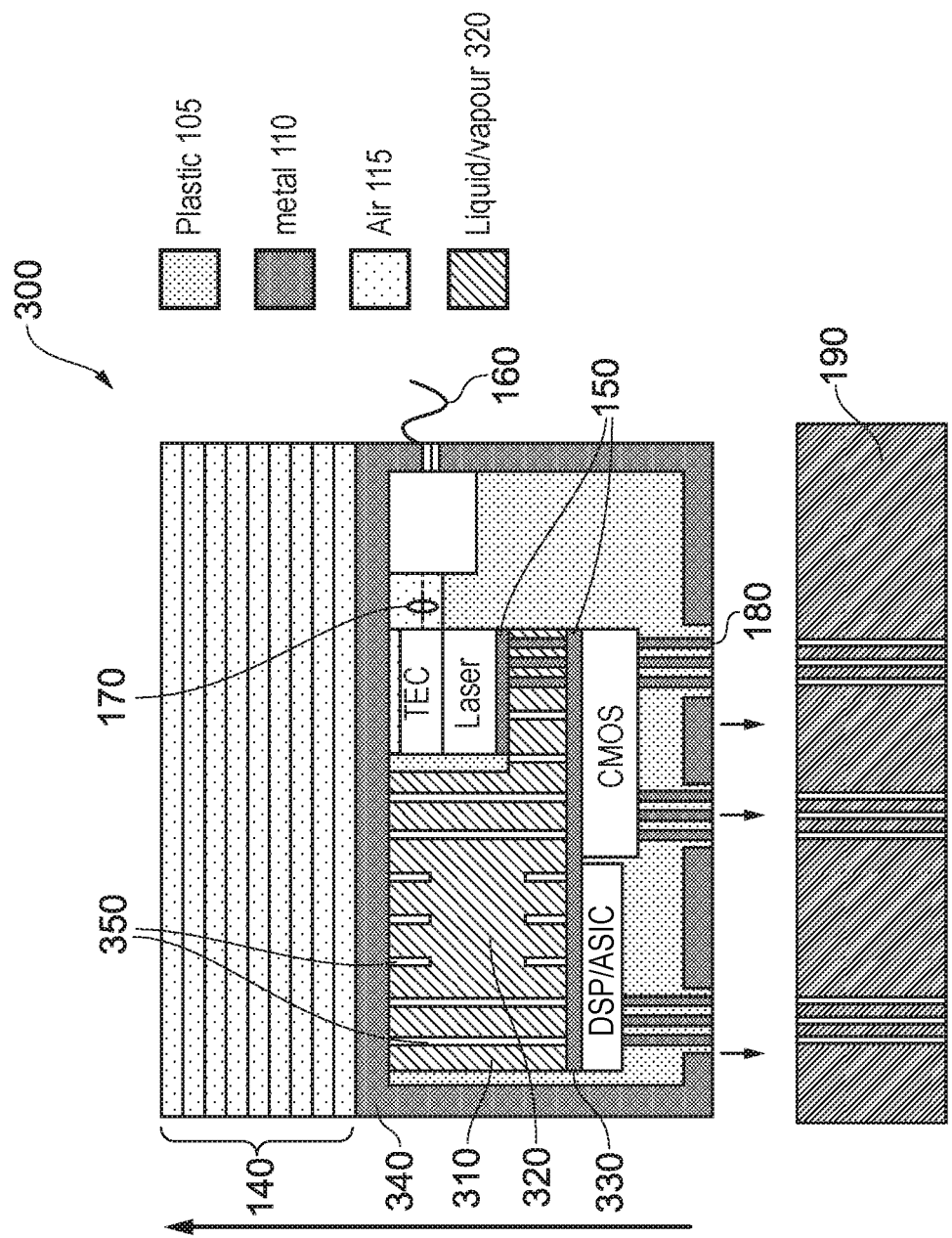
FIG. 3 is a schematic of a photonics integrated circuit for thermal management based on a vapour chamber according to an example.

FIG. 3 shows an example photonics integrated circuit 300 comprising a vapour chamber 310. The vapour chamber may be custom-shaped to fit around components within either a two-dimensional or three-dimensional arrangement. Heat is transferred from the temperature sensitive components using the vapour chamber. The heat may be transferred via a two-phase process in which a working fluid 320, provided inside the vapour chamber, evaporates at component level 330 and condenses at the heat sink side 340. The thermal contact 150 with each component to be cooled is arranged in direct contact with the vapour chamber.

In the example shown in FIG. 3 the components are arranged adjacent the vapour chamber. However, the components may not necessarily be arranged adjacent the vapour chamber provided the thermal contact with each component to be cooled is extended such that it maintains the direct contact with the vapour chamber.

In an example, the vapour chamber is additively manufactured, combining plastic and metal printing to provide electrical and thermal management of the photonics integrated circuit.

In an example, a photonics integrated circuit may be provided with a heat pipe network. The heat pipe network may operate via a two-phase thermal management solution. The heat pipes can passively transfer extremely large heat fluxes.

The heat pipe network may be branched or bifurcated such that sections of the heat pipe extend in two or three dimensions throughout the heat sink. By implementing a heat pipe network in a three-dimensional arrangement, heat can be more efficiently transferred from the components to the heat sink allowing for maximum heat dissipation.

In an example, the heat pipe network is additively manufactured, combining plastic and metal printing to provide electrical and thermal management of the photonics integrated circuit. Custom-shaped heat pipes may be embedded into the package during manufacturing. The use of additive manufacturing techniques allows for the heat pipes to be implemented within the confined geometries of photonics integrated circuits. As such, the methods described allow for a greater degree of design freedom such that the heat pipes are not constrained to simple shapes that are extrusions of two-dimensional objects.

Figure 4:
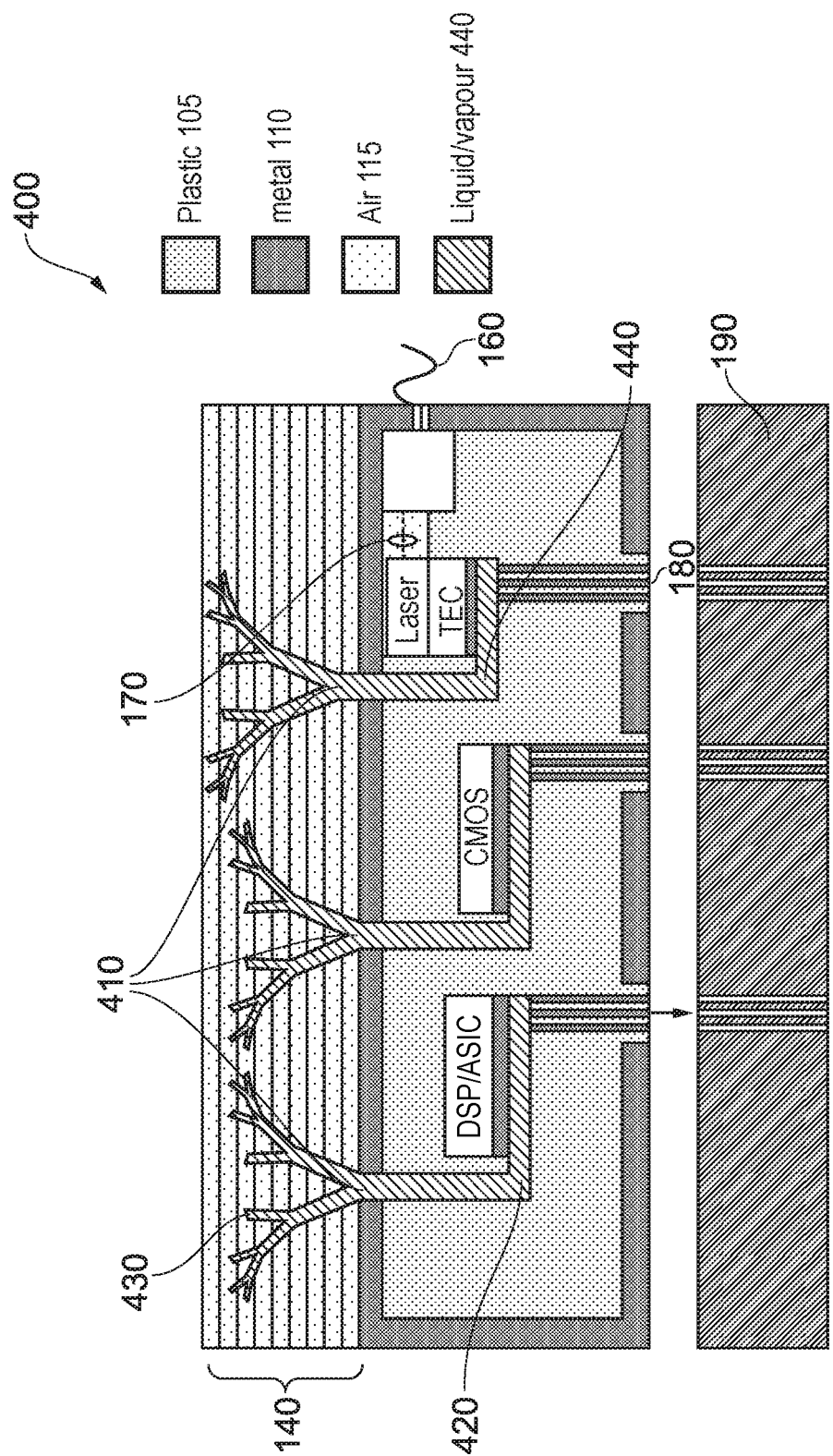
FIG. 4 is a schematic of a photonics integrated circuit for thermal management based on a heat pipe according to an example.

In the example of FIG. 4 is shown a photonics integrated circuit 400 that may be additively manufactured, combining plastic and metal printing to provide electrical and thermal management of the photonics integrated circuit. Heat is transferred from the temperature sensitive components using a series of heat pipe networks 410 which may be custom-shaped. The heat pipe network comprises vapour channels 420 that transfer heat from the component to the heat sink 140. The heat pipe may have a branched or bifurcated structure 430 that permeates into the heat sink. Heat transferred in the vapour from the component to the heat sink condenses in the heat sink allowing it the return to the components via the heat pipe vapour channels. The branched or bifurcated heat pipe structure allows for the spread of heat extremely efficiently to the heat sink for maximum dissipation.

The heat pipes may be filled with an appropriate or suitable working fluid 440. The working fluid may be compatible with the thermal contacts as described above with reference to FIG. 3. The working fluid evaporates at component level, where it subsequently travels through a heat pipe network that permeates the heat sink. Each heat pipe may comprise a vapour channel which is useful in the thermal isolation of the different components.

In the example of FIG. 4, the heat pipes are shown in an arrangement adjacent one another for clarity. In other examples, the heat pipes and components may be stacked in a three-dimensional layout.

The heat pipe network may comprise one or more individual heat pipes. A plurality of thermal contacts 150 may be connected to a respective plurality of components. Where the heat pipe network comprises a plurality of heat pipes, the plurality of heat pipes may be connected to a respective plurality of components.

In an example, the integrated circuit may comprise other components such as an optical connector 160 and coupler 170.

In an example, the package or enclosure may include electrical connections 180 for integration with a motherboard 190 printed circuit board (PCB). The electrical connections may be deposited during an additive manufacturing process. The electrical connections provide through-vias electrically connecting a component to an external region of the package or enclosure for integration of the circuit on a motherboard.

The packages, enclosures and methods described herein enable thermal control or management of an integrated circuit in a manner that allows for a simple, straightforward integration of optical and electronic components. It allows for the provision of photonics integrated circuits with increased performance, which allows for more scalable, efficient networks that can have a high density stacking of components.

By leveraging three dimensional thermal management networks, the methods described improves the density of opto-electronic components in photonics integrated circuits beyond existing architectures based on removing the high contact thermal resistance associated with a photonics integrated circuit heat sink. This allows for the tight stacking of optical and electrical components in three dimensions, enabling greater performance at smaller form factors.

The solutions described herein may be applied more widely to any electronics package requiring tight integration.

Whilst the various thermal management solutions described herein can be employed using existing production techniques, their implementation in three dimensions would be extremely difficult and time consuming to construct without using the additive manufacturing techniques outlined herein.

The methods described herein streamline the process of preparing the electrical connects and feedthroughs (through-vias) between the components by layering up electrical connects as part of the package. The electrical "channels" that are created can be arranged to form a three-dimensional integrated circuit. The wider choices for design architecture from the methods described enables the high density stacking of optical and electronic components in three dimensions.

The methods described can save time resources for preparing the package or enclosure for integration on a motherboard by embedding the electrical connections at the time of manufacture.

The examples described herein allow device and component integration within photonics integrated circuits to keep pace with changes to international bandwidth requirements due to the emergence of new web-based applications. For example, international bandwidth requirements are expected to exceed 1 Pbps by 2020. The examples described improve bandwidth by allowing integration of the optical and electronic components inside the photonics integrated circuit in three dimensions.

The examples described allow for a simple and easy approach, to provide either a two-dimensional or three-dimensional architecture, compared with existing circuit packaging. The methods described overcome significant technical challenges (even in relation to two-dimensional architecture) by reducing the steps required for multiple flip-chip bonding steps and optical alignments. The solutions described allow for a simpler approach to building the architecture and installing circuitry components as part of the packaging building process. The components can therefore be arranged in a three-dimensional layout with respect to each other and the photonics integrated circuit, instead of being restricted to a side-by-side electronic integration arrangement with single or multiple channel photonics integrated circuit modules.

The examples described herein remove the need to incorporate a thermoelectric cooler (TEC) due to the ability to integrate the circuitry with the manufactured packaging or enclosures. Thermoelectric coolers are large components and inefficient from a power perspective and where heat is otherwise conducted from temperature-sensitive components through a heat-spreading material (e.g. aluminium) to the thermoelectric cooler before the heat is transferred out of the photonics integrated circuit to a heat sink in the ambient environment. According to the examples described herein, the ability to integrate the circuitry with the manufactured packaging or enclosures reduces the costs of providing photonics integrated circuits because it removes the need to incorporate a thermoelectric cooler. For example, existing packaging for photonics integrated circuits is currently orders of magnitude more expensive than electronic packaging and costs are expected to increase even further for three-dimensional integrated photonics integrated circuits.

The examples described herein provide a sufficiently tight temperature control for a photonics integrated circuit that contains multiple lasers. The examples described allow for simpler architectures since they remove the need for resistive heaters employed next to each laser with the effect of nearly doubling the thermal load (since a macro-scale thermoelectric cooler will not enable sufficiently tight temperature control on its own and multiple thermoelectric coolers may even be necessary to maintain performance). The ability to provide a simpler architecture therefore reduces costs associated with the packaging for the integrated circuits.

In an example, the thermal contacts may be provided adjacent some or all of the optical and/or electronic components.

All of the components and electrical connections forming the package or enclosure, including any other components and thermal management solutions described herein may be integrally formed with the enclosure.

A microchannel, vapour chamber or heat pipe may be filled with a working fluid during or after a time of manufacture. When filled after manufacture a filling hole may be provided in the enclosure exterior in fluidic communication with the microchannel, vapour chamber or heat pipe, wherein the hole is sealed after filling.

The features described herein may be interchangeable with any of the examples described. For example, any of the features described may be combined or substituted with any of the features described with reference to other examples.

Examples can be embodied in other specific apparatus and/or methods. The described examples are to be considered in all respects as illustrative and not restrictive. In particular, the scope of the invention is indicated by the appended claims rather than by the description and figures herein. All changes that come within the meaning and range of equivalency of the claims are to be embraced within their scope.

The invention claimed is:

1. Method of manufacturing an enclosure for an integrated circuit having at least one optical component and at least one electronic component, the method comprising the steps of:

providing at least one thermal contact connected to at least one of the components; and forming a heat sink that is integral with the enclosure, wherein the at least one thermal contact is a metal-printed path that comprises an electrically and thermally conductive metal suitable for transferring heat from the at least one component to the heat sink.

2. A method according to claim 1, wherein the enclosure is manufactured using additive manufacturing techniques.

3. A method according to claim 2, wherein the at least one component connected to the at least one thermal contact, the at least one thermal contact and the heat sink are positioned relative to one another in three-dimensions or in a stacked configuration.

4. A method according to claim 2, wherein the method comprises a step of:

depositing a metal material and depositing a plastics material, wherein the metal material and plastics material are deposited within a same layer.

5. A method according to claim 4, wherein the method comprises one of the steps of:

forming a microchannel defined within and integrally formed with the enclosure; and forming a vapour chamber defined within and integrally formed with the enclosure.

6. A method according to claim 4, wherein the method comprises a step of:

forming a heat pipe defined within and integrally formed with the enclosure.

7. A method according to claim 6, further comprising embedding a branching structure of the heat pipe within the heat sink.

8. A method according to claim 1, wherein the at least one component connected to the at least one thermal contact, the at least one thermal contact and the heat sink are positioned relative to one another in three-dimensions or in a stacked configuration.

9. A method according to claim 1, wherein the method comprises a step of:

depositing a metal material and depositing a plastics material, wherein the metal material and plastics material are deposited within a same layer.

10. A method according to claim 1, wherein the method comprises one of the steps of:

forming a microchannel defined within and integrally formed with the enclosure; and forming a vapour chamber defined within and integrally formed with the enclosure.

11. A method according to claim 1, wherein the method comprises a step of:

forming a heat pipe defined within and integrally formed with the enclosure.

12. A method according to claim 11, further comprising embedding a branching structure of the heat pipe within the heat sink.

13. A method according to claim 1, wherein the method comprises a step of:

forming an electrical connection between each component and an external region of the enclosure.

14. A package comprising an enclosure and an integrated circuit, the enclosure enclosing at least a part of the integrated circuit, the integrated circuit comprising:

at least one optical component, and at least one electronic component;

at least one thermal contact connected to at least one of the components; and a heat sink that is integrally formed with the enclosure, wherein the at least one thermal contact is a metal-printed path that comprises an electrically and thermally conductive metal suitable for transferring heat from the at least one of the components to the heat sink.

15. A package according to claim 14, wherein the heat sink is integrally formed with the thermal contact.

16. A package according to claim 14, comprising at least one embedded liquid microchannel adjacent the at least one thermal contact.

17. A package according to claim 16, further comprising a pump.

18. A package according to claim 14, comprising at least one vapour chamber thermally connecting the at least one thermal contact to the heat sink.

19. A package according to claim 14, comprising at least one heat pipe thermally connecting the at least one thermal contact to the heat sink.

20. A package according to claim 19, wherein the at least one heat pipe has a branching structure embedded within the heat sink.

* * * * *